(12) United States Patent
Borri et al.

(10) Patent No.: US 7,085,972 B2
(45) Date of Patent: Aug. 1, 2006

(54) SYSTEM FOR TESTING A GROUP OF FUNCTIONALLY INDEPENDENT MEMORIES AND FOR REPLACING FAILING MEMORY WORDS

(75) Inventors: Simone Borri, Antibes (FR); Stephane Kirmser, Munich (DE)

(73) Assignee: Infineon Technologies AG, Munich (DE)

( * ) Notice: Subject to any disclaimer, the term of this patent is extended or adjusted under 35 U.S.C. 154(b) by 284 days.

(21) Appl. No.: 10/449,580

(22) Filed: May 30, 2003

(65) Prior Publication Data
US 2003/0237033 A1 Dec. 25, 2003

(30) Foreign Application Priority Data
Jun. 4, 2002 (EP) .................. 02012318

(51) Int. Cl.
*G11C 29/00* (2006.01)
(52) U.S. Cl. .............. 714/710; 714/718; 714/733
(58) Field of Classification Search ........... 365/200, 365/201; 714/710, 718, 723, 733
See application file for complete search history.

(56) References Cited

U.S. PATENT DOCUMENTS

| | | | |
|---|---|---|---|
| 5,677,883 A * | 10/1997 | Miwa | 365/200 |
| 5,734,615 A | 3/1998 | Dierke | |
| 5,784,321 A * | 7/1998 | Yamamura | 365/200 |
| 5,982,684 A * | 11/1999 | Schwartzlow et al. | 365/201 |
| 6,198,669 B1 | 3/2001 | Iguchi | |
| 6,256,243 B1 * | 7/2001 | Savignac et al. | 365/201 |
| 6,385,746 B1 | 5/2002 | Tatsumi | |
| 6,505,313 B1 * | 1/2003 | Phan et al. | 714/718 |
| 2001/0027546 A1 | 10/2001 | Kouchi et al. | |

FOREIGN PATENT DOCUMENTS

| | | |
|---|---|---|
| DE | 100 02 127 A1 | 8/2001 |
| WO | WO 01/59790 A1 | 8/2001 |

OTHER PUBLICATIONS

Schober et al., "Memory Built-In Self-Repair using redundant words," ITC International Test Conference, IEEE (Germany), p. 995-1001, (2001).

* cited by examiner

*Primary Examiner*—David Ton
(74) *Attorney, Agent, or Firm*—Jenkins, Wilson, Taylor & Hunt, P.A.

(57) ABSTRACT

System for testing a group of functionally independent memories (102) and for replacing failing memory words of the group of functionally independent memories (102) by redundant memory words, comprising: redundancy means 108) including at least one array of redundant memory words (108a) and address registers (108b) connected to at least one array of redundant memory words (108a); a test means (114); a group of first multiplexers (110) following the test means (114) and preceding the memories (102) and the at least one array of redundant memory words (108a); and a group of second multiplexers (112) following the memories (102) and the at least one array of redundant memory words (108a), wherein each second multiplexer (112) is connectable to the test means (114).

7 Claims, 7 Drawing Sheets

SYSTEM FOR TESTING A GROUP OF FUNCTIONALLY INDEPENDENT MEMORIES AND FOR REPLACING FAILING MEMORY WORDS

TECHNICAL FIELD

The present invention relates to a memory test structure and specifically to a system for replacing failing memory words of a group of functionally independent memories by redundant memory words.

BACKGROUND ART

Today's deep submicron technologies allow the implementation of a huge amount of memory on a single chip. Typically, chips contain a large number of embedded small to medium size memories, e.g. SRAMs, and a few very large blocks, e.g. DRAMs. Due to their high density memories are more prone to faults. These memory faults decrease the total chip yield. One way to solve this problem is to enhance the memory by redundant memory locations or by a word redundancy. Word redundancy allows adding redundant registers to either a single SRAM block, or an SRAM block made up by more than one memory macros, with the possibility to detect the memory faults and activate the corresponding redundant memory locations to correct the memory faults on-line, during a memory test. Memories are tested either by external test hardware or by an on-chip dedicated hardware called a Memory Built-In Self Test (MBIST) which is the preferred approach for embedded memories. After the memory test, the information regarding the addresses of the memory faults is extracted from the chip and used to program associated on-chip laser fuses, which will permanently store this information.

FIG. 5 shows a prior art word oriented memory test structure for Built-in Self-Repair (BISR) of a RAM memory module 502, proposed by V. Schoeber, S. Paul, O. Picot, in "Memory Built-in Self-Repair using redundant words", Proceedings of International Test Conference 2001, pp. 995–1001. The test structure comprises memory built-in self test (MBIST) logic 504 and redundancy logic 506 placed in parallel to the RAM memory module 502 to replace defect or failing memory words by redundant memory words. The test structure further comprises fuse boxes 508 including fuses to permanently store the addresses of failing memory words, a first multiplexer 510 in front of the RAM memory module 502, and a second multiplexer 512. The second multiplexer 512 is provided at the output of the RAM memory module 502 and the redundancy logic 506 and decides where to take the data from.

The MBIST logic 504 provides a read/write signal 514, a write data signal 516 and an address signal 518 to the first multiplexer 510 and a fail signal 520, a fail_address signal 522 and an expected_data signal 524 to the redundancy logic 506. The redundancy logic 506 receives the fail signal 520, the fail_address signal 522 and the expected_data signal 524 from the MBIST logic 504 and provides a data signal 526 and a control signal 528 to the second multiplexer 512. Furthermore, the redundancy logic 506 is connected to the fuse boxes 508 by a connection 530. The first multiplexer 510 receives the read/write signal 514, the write data signal 516 and the address signal 518 from the MBIST logic 504 and a data signal 532, an address signal 534 and a control signal 536 from e.g. a memory bus. The first multiplexer 510 comprises an output 538 connected to the redundancy logic 506 and the RAM memory module 502. The output 538 serves to either provide test patterns from the memory BIST logic 504 to the RAM memory module 502/redundancy logic 506 via the write data signal 516 or to provide data from e.g. a memory bus to the RAM memory module 502/redundancy logic 506 via the data signal 532. The second multiplexer 512 receives a data signal 540 from the RAM memory module 502 and the data signal 526 and the control signal 528 from the redundancy logic 506 and provides a data signal 542 of selected data.

FIG. 6 shows the prior art MBIST logic 504 of FIG. 5 in more detail. The MBIST logic 504 comprises an address register 544 and a write data register 546 for providing the address signal 518 and the write data signal 516 to the first multiplexer 510. The MBIST logic 504 additionally comprises a further address register 548 for storing the address of a failing memory location and for providing the fail_address signal 522, and a further data register 550 for storing the expected data and for providing the expected_data signal 524. The expected_data signal 524 is compared to the data signal 540 of the RAM memory module 502 after test data has been stored in a predetermined memory location under test via the write data signal 516. Therefore, the MBIST logic 504 further comprises a comparator 552 for comparing the expected data to the results of RAM data, that is, for comparing the data signal 540 of the RAM memory module 502 with the expected_data signal 524, and for providing a result 554 of the comparison. The MBIST logic 504 further includes a controller 556 for controlling a means 558 for providing the fail signal 520 in dependence of the result 554. The fail signal 520 is used to store data in the fuse boxes 508 and can be used as a write enable for the redundancy logic 506.

The data comes from MBIST logic 504 during test for each failing or defect memory word individually. An on chip memory test runs through the address space of the RAM memory module 502 and performs write and read operations in a given order, depending on the test algorithm. The memory output is compared to the expected data. If the memory words differ, part of the respective memory word is defect. In this case, the failing address and its data will be stored in the redundancy logic 506. Therfore the redundancy logic 506 comprises redundant or spare memory words arranged in an array of a plurality of redundant word lines and control logic to program the address decoding.

FIG. 7 shows one redundant memory word or redundant word line of a plurality of word lines contained in the redundancy logic 506 of FIG. 1. The redundant word line 560 includes a FA register 562, an address register 564, a data register 566, a comparator 568 and two AND gates 570, 572. If an address is stored in the address register 564 the FA register 562 is set to "1" to activate the redundant memory word. Then, the data register 566 is used for reading and writing instead of the RAM memory module 502. An address comparison is performed in the comparator 568. The address (A) 574 of an access to the entire memory space is compared to the address that is stored in the respective address registers 564 of redundant word lines. During test MBIST logic 504 prepares the fail signal 520, the fail_address signal 522, and the expected_data signal 524. A Read (R) 576, a Write (WR) 578, the Address (A) 574 and a data input (DI) 580 are accessed in parallel to the RAM memory module 502 and the redundancy logic 506 during functional operation and test. 582 (TDI) and 584 (TDO) are serial interfaces for the redundancy logic 506.

The programming of the failing addresses is done during the memory BIST or from the fuse boxes 508 during memory setup. Failing addresses that are stored in the address registers 564 of redundant word lines can be streamed out or read out after test completion to program the fuse boxes 508 by blowing fuses therein. To stream in and out data during test and redundancy configuration, the fuse boxes 508 can be connected via scan registers to the redundancy logic 506. In a fuse box multiple fuses and their scan register are placed in parallel. An additional fuse cell is necessary to activate a programmed address. The scan registers e.g. scan flip-flops are configured as a serial scan chain that can be activated during scan mode. The data output of the scan register is connected to the input of the fuse box. Fuse boxes can be placed inside or outside the redundancy logic 506 on-chip or off-chip to store identified failures after memory test. Fuses on-chip are state of the art. One fuse carries one address bit. The fuse itself is nothing more than a polysilicon or metal resistor, depending on technology. If the fuse boxes are placed outside of the redundancy logic 506 two configurations are possible. Parallel buses may connect the fuse boxes to the address registers of the redundant memory words. Instead of parallel access it is also possible to implement serial shift logic between the fuse boxes and the redundant memory words.

With the prior art test structure described above, if multiple functionally independent memories are present on a chip, a dedicated redundancy and test structure has to be provided for each memory. Therefore, a separate BIST controller and dedicated fuse boxes are needed for each memory increasing area overhead and test complexity. Furthermore, an efficient use of redundant words is impossible.

SUMMARY OF THE INVENTION

The object of the present invention is to provide a simple and space saving system for testing a group of functionally independent memories and replacing failing memory words of the group of functionally independent memories by redundant memory words.

This object is achieved by a system for testing a group of functionally independent memories and replacing failing memory words of the group of functionally independent memories by redundant memory words according to claim 1.

The present invention relates to a system and an architecture for testing and repairing multiple independent memories with e.g. same data width present on the same chip, in which a test logic, preferably a BIST logic, sees functionally independent memories as a single larger memory with a size equal to the sum of all the individual memory sizes. The architecture allows sharing the test logic and redundancy logic between multiple independent embedded-RAMs. Test and repair procedures may allocate available redundant words within the full address space. This considerably reduces the area overhead of the test logic and the redundancy logic and increases the possible yield improvement compared to the prior art, where an equivalent number of redundant words would not be shareable among functionally independent RAM memories.

The present invention provides a system for testing a group of functionally independent memories and for replacing failing memory words of the group of functionally independent memories by redundant memory words, comprising: a redundancy means including at least one array of redundant memory words and address registers connected to the at least one array of redundant memory words for storing and retrieving addresses of failing memory words; a test means including a test data output and a test address output for providing test data and test addresses to each memory of the group of functionally independent memories; a group of first multiplexers for respectively either connecting the test data output and the test address output of the test means or a respective functional data/address input to a respective data/address input of an associated memory and to a respective data/address input of the at least one array of redundant memory words; and a group of second multiplexers for respectively either connecting a respective memory data output of an associated memory or a respective redundancy data output of the at least one array of redundant memory words to a data output of a respective second multiplexer, wherein the data output of each second multiplexer is connectable to a data input of the test means for receiving data from each memory of the group of functionally independent memories.

According to one aspect of the present invention the test means includes a test controller for at least generating test data and test address data, and an address transcoding means for decoding test addresses of a test address space generated by the test controller into addresses of the memories.

According to another aspect of the present invention the system includes a data multiplexer comprising a plurality of data inputs respectively connected to the data outputs of the group of second multiplexers, and a data output connected to the data input of the test means.

According to another aspect of the present invention the redundancy means comprises plural arrays of redundant memory words, wherein each array is spatially and functionally associated to a respective memory of the group of functionally independent memories.

According to another aspect of the present invention the address registers of the redundancy means are connected to fuse boxes comprising fuses to permanently store the addresses of failing memory words.

According to another aspect of the present invention the group of functionally independent memories is a group of static random access memories (SRAM).

According to another aspect of the present invention the test means is a built-in self test (BIST) means.

BRIEF DESCRIPTION OF THE DRAWINGS

Preferred embodiments of the present invention are described with reference to the enclosed drawings, in which.

DETAILED DESCRIPTION OF THE INVENTION

Figure 1:
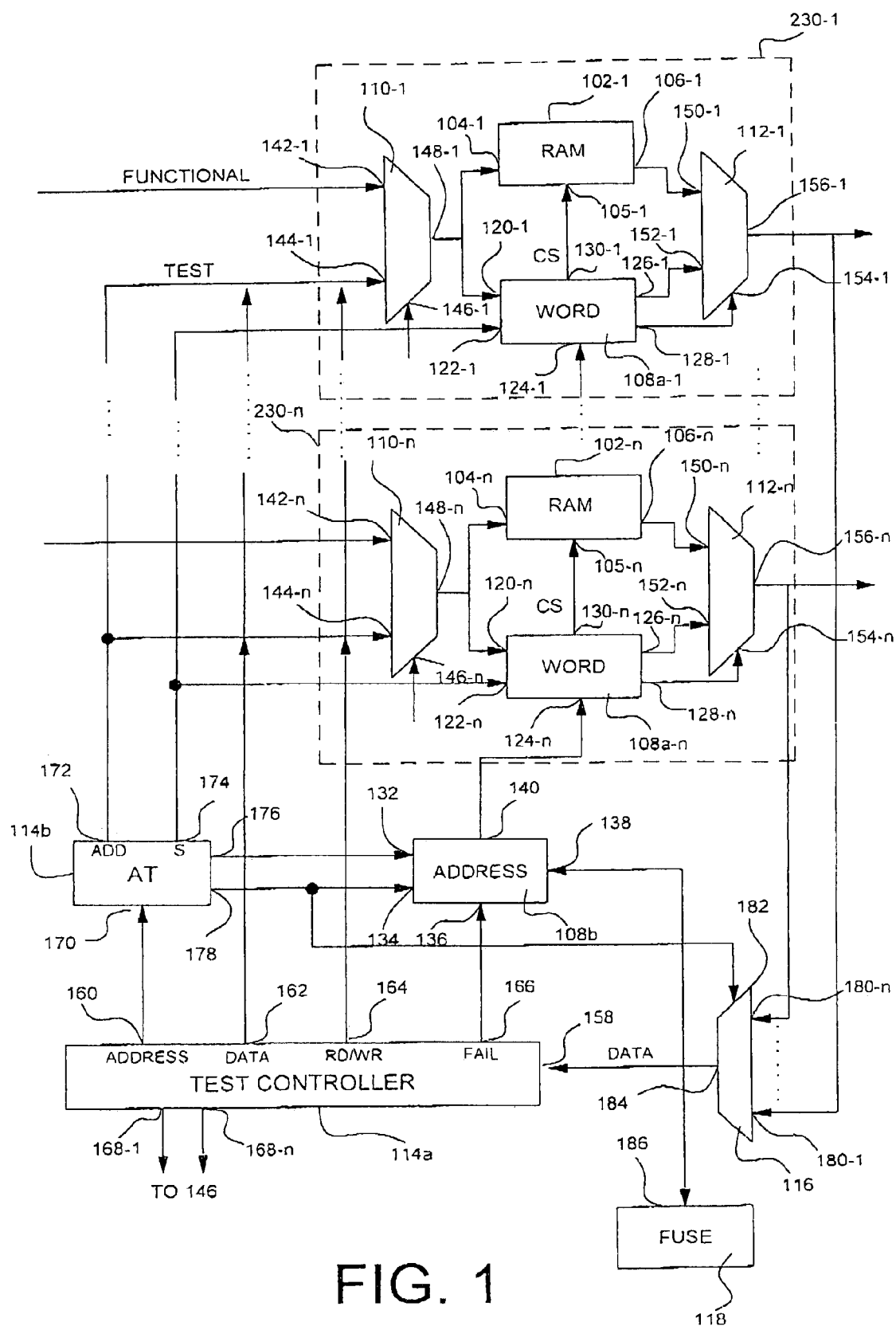
FIG. 1 depicts a first embodiment of a system according to the present invention.
Figure 4:
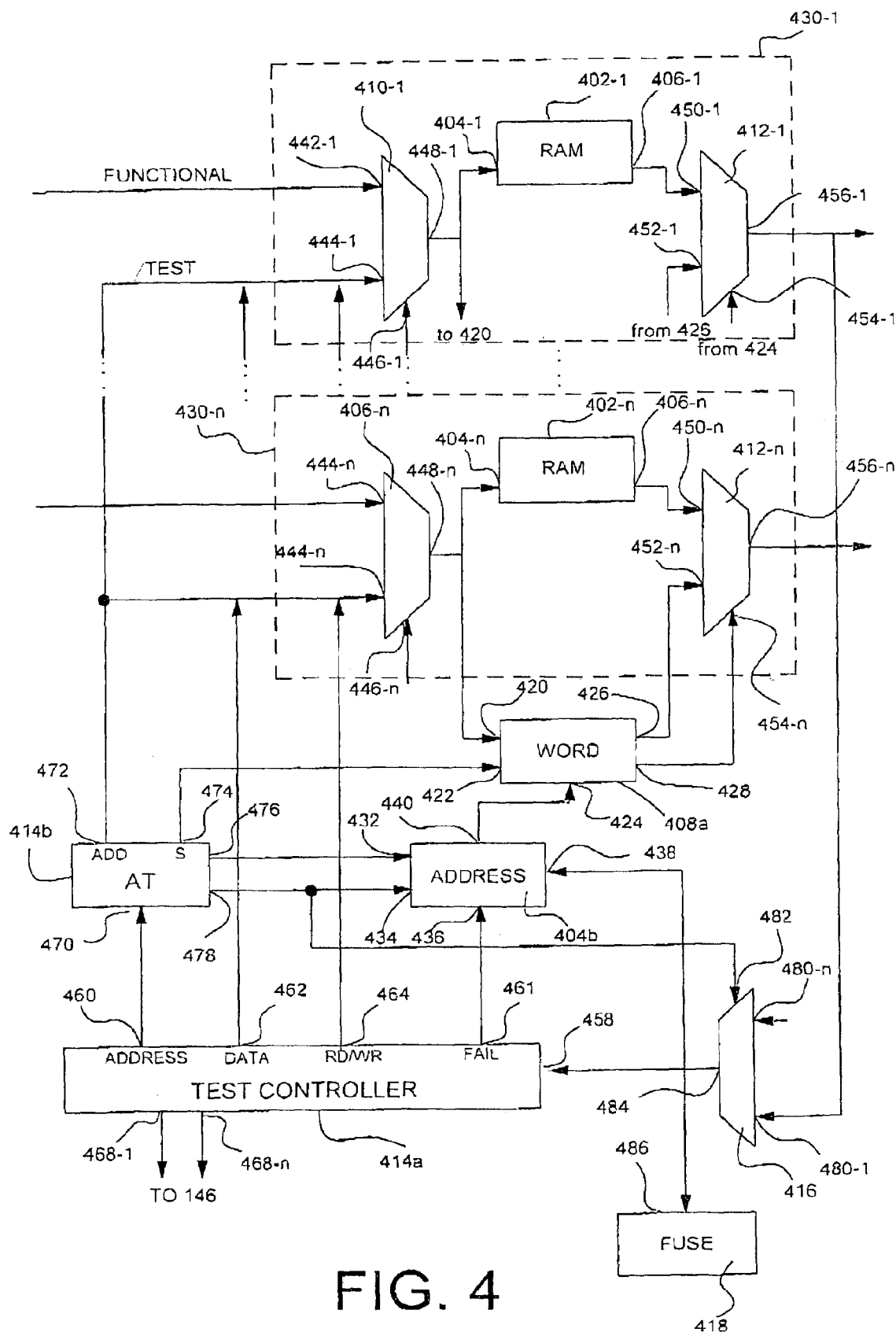
FIG. 4 depicts a second embodiment of a system according to the present invention.

In FIG. 1 and FIG. 4 corresponding or similar features are denoted by reference signs made up of the number of the drawing followed by the number of the corresponding feature.

According to a first embodiment of the present invention a shared-fuses/distributed-words architecture allows sharing fuse boxes, test logic and address registers among functionally independent memories, while associating groups of respective redundant memory words to each memory in order to minimize routing congestion and impact of functional timings. In test mode, the test and repair procedures run on a group of memories as if they were a single larger memory, thus allowing to share address registers and fuse boxes among all memories, while providing dedicated redundant memory words to each memory to keep at a minimum the routing congestion.

FIG. 1 depicts a first embodiment of a system according to the present invention for replacing failing memory words of a group of functionally independent memories 102-1, ..., 102-n (102) or memory blocks. The memories preferably are static random access memories (SRAM). The group of functionally independent memories comprises n independent memories 102 preferably of same data width and each of size M(i) Kbits (i=1 ... n). Therefore the total memory size of all independent memories is defined as:

$$Mtot = \sum_{i=1}^{n} M(i) \text{ Kbits}$$

Each memory 102 comprises a data/address/read/write input 104-1, ..., 104-n (104), a chip select input 105-1, ..., 105-n (105), and a memory data output 106-1, ..., 106-n (106).

The illustrated system comprises a redundancy logic 108, a group of n test multiplexers 110-1, ..., 110-n (110), a group of n memory/redundancy output multiplexers 112-1, ..., 112-n (112), a test logic 114, a data multiplexer 116, and fuse boxes 118. In this embodiment the redundancy logic 108 includes single arrays of redundant memory words 108a-1, ..., 108a-n (108a), wherein each array of redundant memory words 108a is spatially and functionally associated to a respective memory of the group of functionally independent memories 102. The redundancy logic 108 furthermore includes address registers 108b connected to all arrays of redundant memory words 108a for temporarily storing the addresses of failing memory words detected during test mode. The test logic 114 preferably comprises a test controller 114a, e.g. a BIST controller, for implementing the test algorithms for a memory of a total of Mtot Kbits, and an address transcoder 114b, both active in test mode only.

The arrays of redundant memory words 108a of the redundancy logic 108 each comprise a data/address/read/write input 120-1, ..., 120-n (120), a select input 122-1, ..., 122-n (122), a address/block-ID/enable input 124-1, ..., 124-n (124), a redundancy data output 126-1, ..., 126-n (126), a control output 128-1, ..., 128-n (128), and a chip select output 130-1, ..., 130-n (130). The chip select output 130 is respectively connected to the chip select input 105 of each associated memory 102 for providing a respective chip select signal comprising addresses provided from the arrays of redundant memory words 108a to the respective memory 102.

The address registers 108b comprise a test address input 132, a block-ID input 134, a fail input 136, a fail address input/output 138, and a data/address/block-ID/enable output 140. The data/address/block-ID/enable output 140 of the address registers 108b is connected to the address/block-ID/enable input 124 of each array of redundant memory words 108a.

Each test multiplexer 110 comprises a data/address/read/write input 142-1, ..., 142-n (142) for the input of functional data and functional address data received from outside of the system over respective functional data/address inputs, a test data/address/read/write input 144-1, ..., 144-n (144), an enable input 146-1, ..., 146-n (146), and a data/address output 148-1, ..., 148-n (148). The data/address/read/write input 120 of each array of redundant memory words 108a and the data/address/read/write input 104 of each memory 102 are respectively connected to the data/address output 148 of an associated test multiplexer 110 for receiving either functional data/addresses from outside the system or test data/addresses from test logic 114 intended for a respective memory 102 or redundant memory word.

Figure 6:
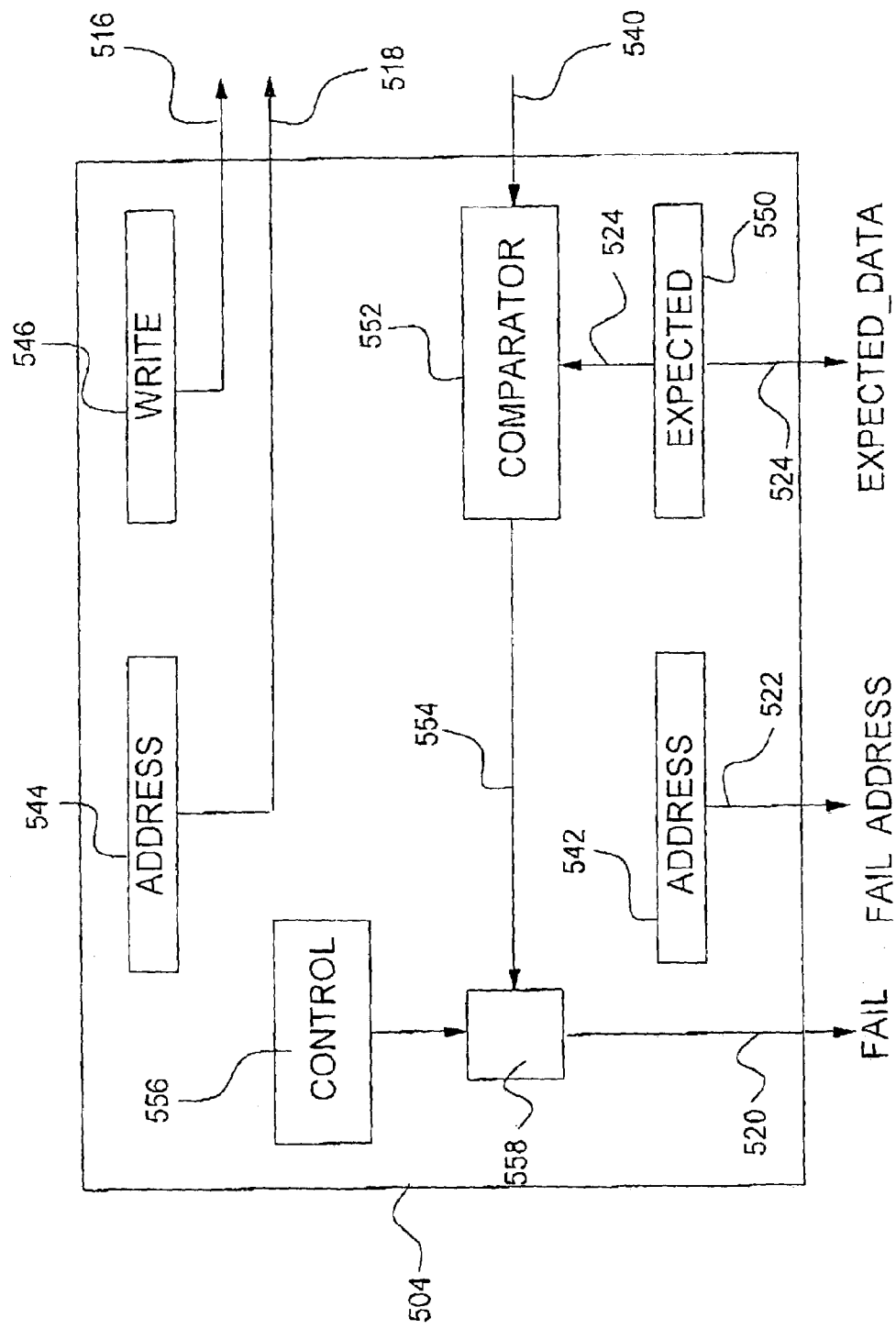
FIG. 6 illustrates a prior art MBIST logic in more detail.
Figure 7:
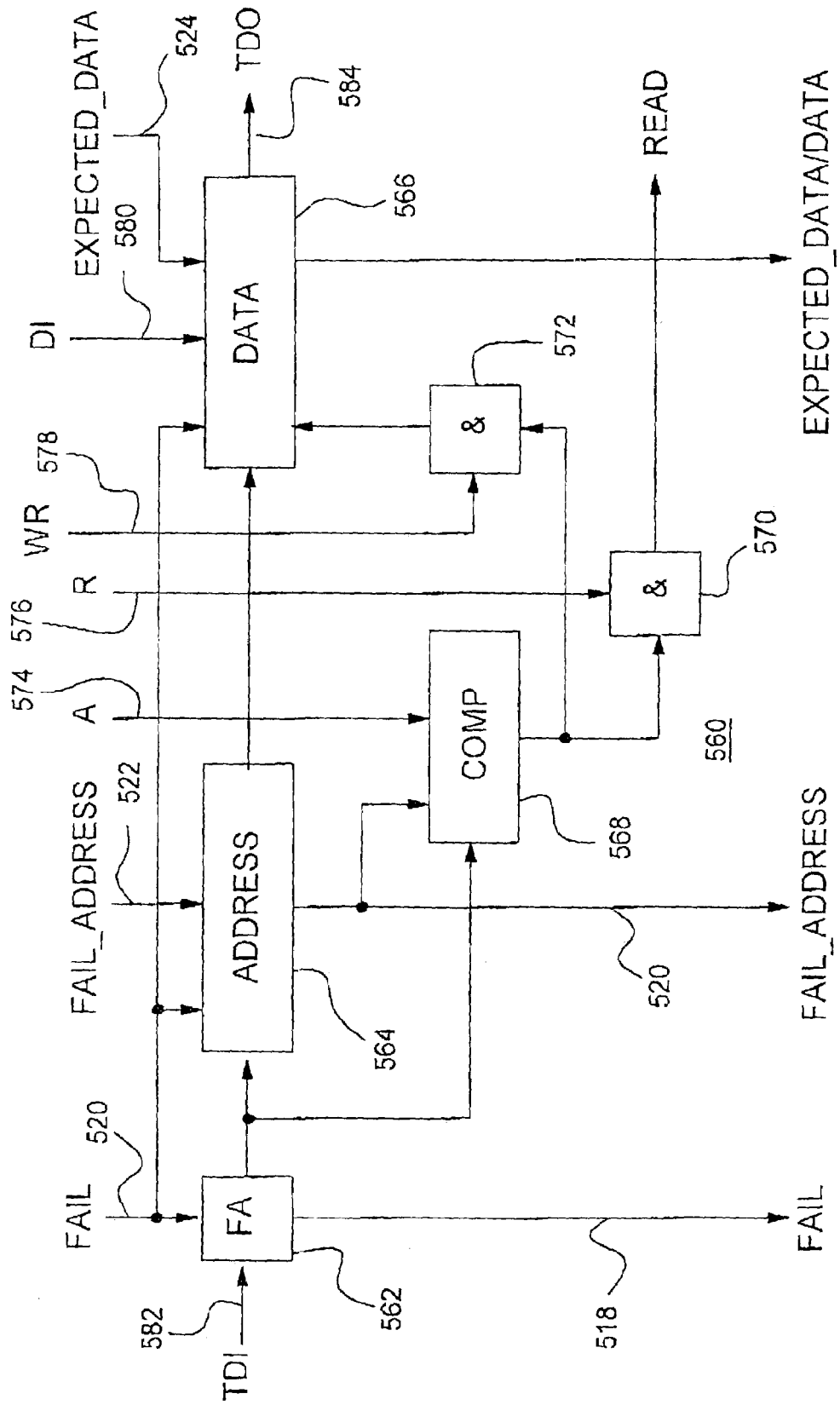
FIG. 7 illustrates a prior art redundant word line.

Each memory/redundancy output multiplexer of the group of memory/redundancy output multiplexers 112 comprises a memory data input 150-1, ..., 150-n (150) for receiving memory data provided by the memory data output 106 of each respective memory 102, and a redundancy data input 152-1, ..., 152-n (152) for receiving redundancy data provided by the redundancy data output 126 of each respective array of redundant memory words 108a. Each memory/redundancy output multiplexer 112 further comprises a control input 154-1, ..., 154-n (154) connected to the control output 128 of each respective array of redundant memory words 108a for controlling the selection of either data coming from each respective memory 102 or data coming from each respective array of redundant memory words 108a when substituting failing memory words. Each memory/redundancy output multiplexer 112 furthermore comprises a data output 156-1, ..., 156-n (156) for outputting selected data. In normal mode, this data output 156 serves to output data read from a respective memory 102, or when accessing the address of a failing memory word, data read from a redundant memory word of a respective array of redundant memory words 108a. In test mode, each data output 156 serves to output test data written to a memory word of a respective memory 102 under test. For example, these test data are compared to expected data in the test logic 114 as detailed in FIG. 2 and 6.

Figure 5:
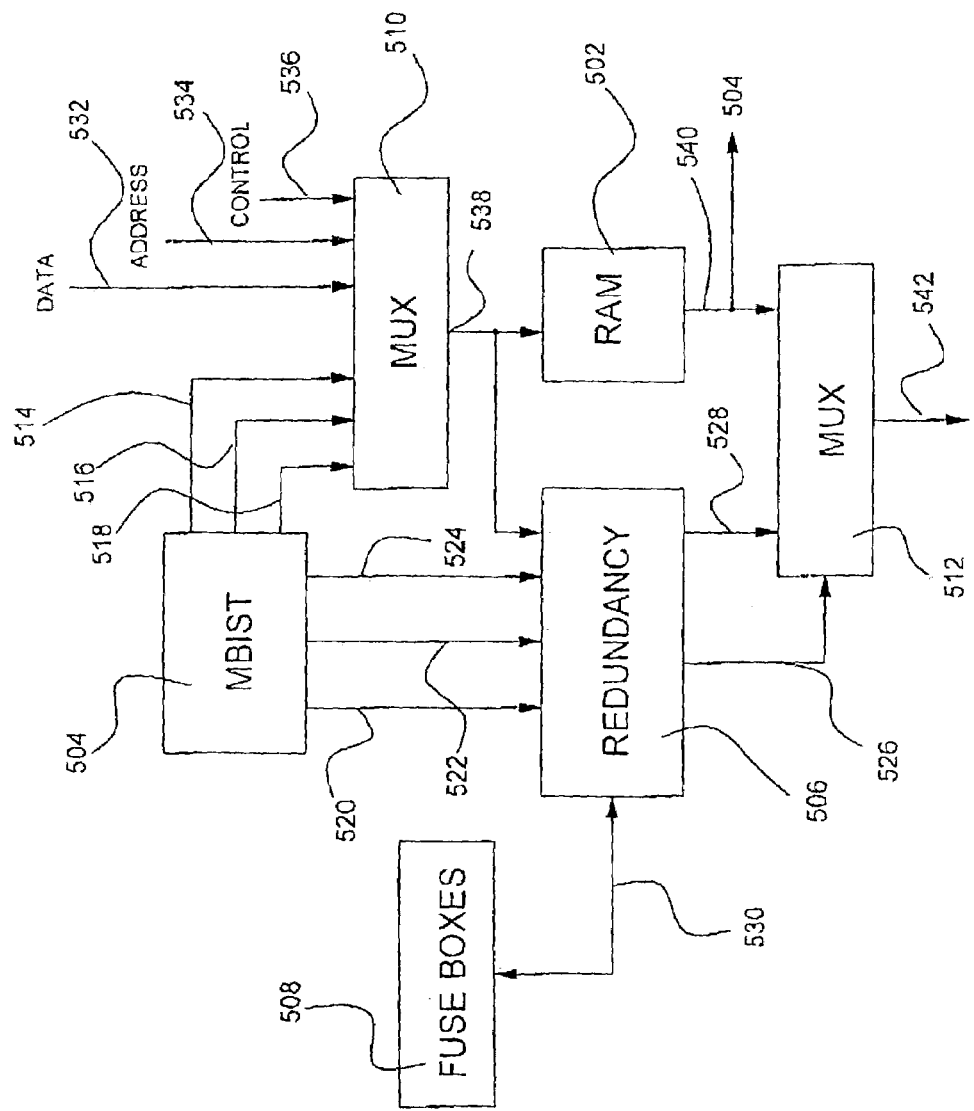
FIG. 5 depicts a prior art word oriented memory test structure.

In contrast to the prior art according to FIG. 5 wherein the data signal 540 from the RAM memory module 502 is fed back to the MBIST logic 504, in the present invention both data written to and read from a respective memory 102 and data written to and read from a respective array of redundant memory words 108a may be fed back to the test logic 114 using a respective memory/redundancy output multiplexer 112. Therefore, and in contrast to the prior art, in the present invention not only testing of each memory 102 but also testing of each array of redundant memory words 108 is possible. Also, plural test runs may be performed for example for testing the memories 102 and the arrays of redundant memory words 108a under different operating and environmental conditions like temperature, operating frequency etc. Also, a complete reset of the redundancy logic 108 or just a partial reset excluding the address registers 108b is possible (warm start).

The test controller 114a of the test logic 114 comprises a data input 158, a test address output 160, a test data output 162, a read/write output 164, a fail output 166, and enable outputs 168-1, ..., 168-n (168). The data input 158 is connected via the data multiplexer 116 to all data outputs 156 of the memory/redundancy output multiplexers 112. The test data output 162 and the read/write output 164 of the test controller 114a are respectively connected to the test data/address/read/write input 144 of each test multiplexer 110. The enable outputs 168 of the test controller 110a are respectively connected to the enable input 146 of a test multiplexer 110 for selecting either functional data/addresses in normal mode or test data/addresses in test mode. Therefore, the enable input 146 is active when the test mode is enabled. The fail output 166 of the test controller 114a is connected to the fail input 136 of the address registers 108b for providing a fail signal to the address registers 108b. The fail signal indicates that the corresponding tested memory word is failing and its address needs to be stored in the address registers 108b.

The address transcoder 114b of the test logic 114 comprises a test address input 170, a first test address output 172, a select output 174, a second test address output 176, and a block-ID output 178. The test address input 170 is connected to the test address output 160 of the test controller 114a for receiving test address data generated or stored in the test controller 114a. The first test address output 172 is connected to the test data/address/read/write input 144 of each test multiplexer 110 for providing test addresses to the respective test multiplexers 110 and then to addresses of memory words under test. The select output 174 is connected to the select input 122 of each array of redundant memory words 108a. The second test address output 176 is connected to the test address input 132 of the address registers 108b. The block-ID output 178 is connected to the block-ID input 134 of the address registers 108b.

The address transcoder 114b receives test addresses from the test controller 114a over the test address input 170. The test addresses are part of a test address space in which test logic 114 sees all memories 102 as a single memory. Therefore, in test mode the arrangement of FIG. 1 behaves like a single memory of a total size Mtot Kbits. In the address transcoder 114b test addresses according to a predetermined mapping rule are decoded or transcoded and descrambled into addresses of address sub spaces associated to each memory 102, select bits for the selection of a respective memory to write to, and an enable bit for indicating if the address is the address of a failing memory word. For example, the address provided by the test address output 160 of the test controller 114a may contain 14 bits, whereas the address provided by the first test address output 172 of the address transcoder 114b may contain 12 bits, and the select signal provided by the select output 174 of the address transcoder 114b may contain 3 bits.

The data multiplexer 116 comprises data inputs 180-1, . . . , 180-n (180), a block-ID input 182, and a data output 184. The data inputs 180 are respectively connected to the data outputs 156 of the memory/redundancy output multiplexers 112 for receiving data therefrom. The block-ID input 182 is also connected to the block-ID output 178 of the address transcoder 114b for controlling the selection of data from a respective data output 156. The data output 184 is connected to the data input 158 of the test controller 114a for providing selected data in dependence of the state of a signal at the block-ID input 182.

The fuse boxes 118 comprise a fail address input/output 186 connected to the fail address input/output 138 of the address registers 108b for permanently storing the addresses of failing memory words in the fuse boxes 114 and reading addresses of failing memory words stored in the fuse boxes 118. The address registers 108b are preferably used for temporarily storing the addresses of failing memory words detected during test mode, and then to serially stream out these values into an external tester. The tester analyses these values and permanently programs the addresses of failing memory words into the fuse boxes e.g. by laser. Alternatively, for a prefuse test the addresses of failing memory words can be streamed out directly into the fuse boxes 118 for testing the connection of address registers and fuses.

Figure 2:
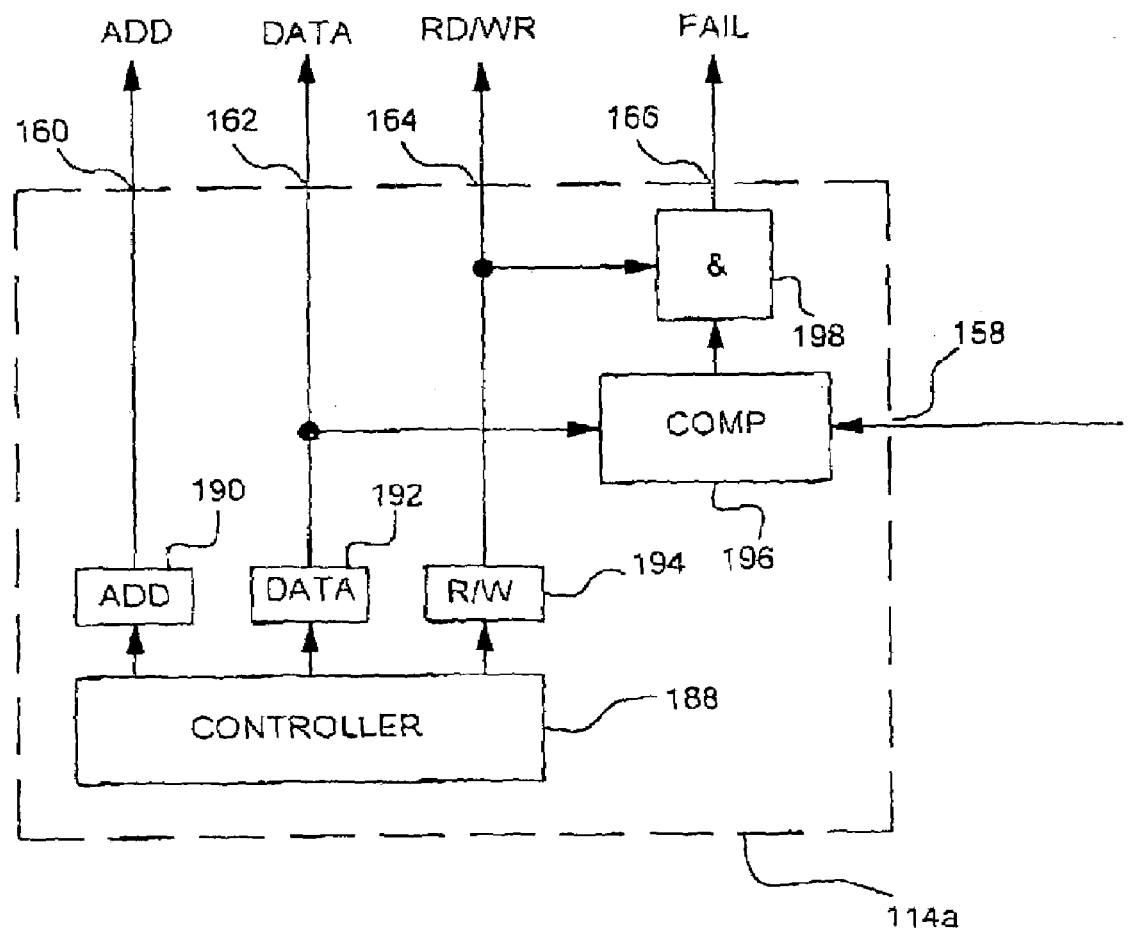
FIG. 2 depicts details of a test controller according to the present invention.

FIG. 2 depicts the test controller 114a in more detail. The test controller 114a includes a controller 188, a test address register 190, a test data register 192, a read/write register 194, a comparator 196, and an AND gate 198. The controller 188 comprises a first, a second and a third control output. The first control output is connected to a control input of the test address register 190 for controlling the provision of test addresses at the test address output 160 of the test controller 114a. The second control output is connected to a control input of the test data register 192 for controlling the provision of test data at the test data output 162 of the test controller 114a. The third control output of the controller 188 is connected to a control input of the read/write register 194 for signalling the reading or writing of test data into the memories 102 and the arrays of redundant memory words 108. The comparator 196 comprises the data input 158, a test data input, and a compare output. The test data input is connected to the test data output 162 of the test controller 114a. The comparator 196 compares the test data provided by the test data register 192 with data read from a respective memory 102 or a respective memory word of an array of redundant memory words 108a received from the data multiplexer 116. By doing this, read data can be compared with expected data and a decision can be made if a memory word is failing. The AND gate 198 comprises a compare input, a read/write input, and the fail output 166. If reading or writing of the memories 102 or the arrays of redundant memory words 108a is performed and the expected data corresponds to read data, the AND gate 198 signals that the tested memory word is correctly functioning.

Figure 3:
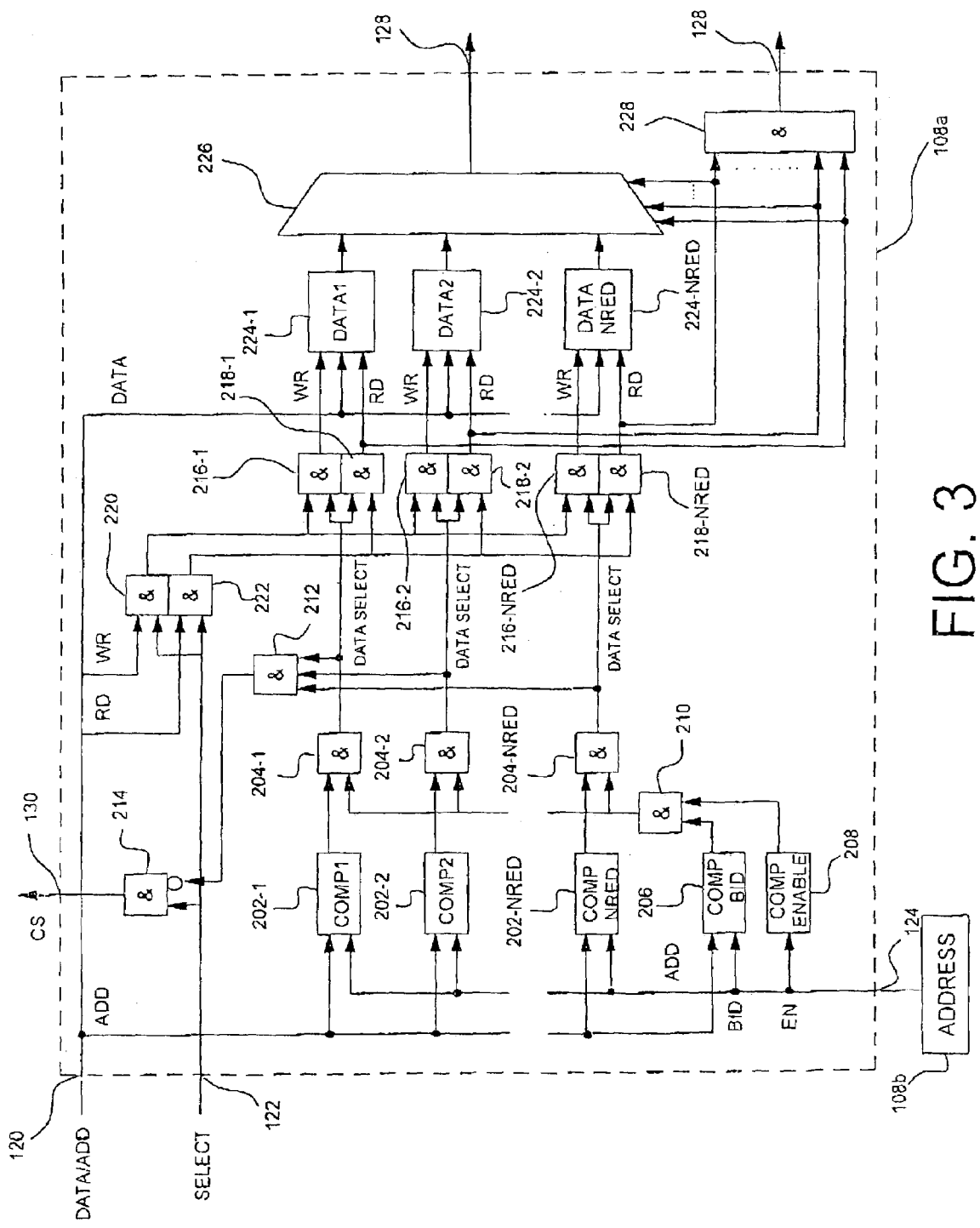
FIG. 3 depicts details of an array of redundant memory words according to the present invention.

FIG. 3 depicts an array of redundant memory words in more detail. The array of redundant memory words 108a receives functional data/addresses or test data/addresses and read/write signals (RD/WR) over the data/address/read/write input 120. A select signal is received over the select input 122. Due to the connection to the address registers 108b the array of redundant memory words 108a receives a plurality of bits including address bits, block-ID bits and an enable bit over the address/block-ID/enable input 124. The array of redundant memory words 108a outputs data contained in the array of redundant memory words over the redundancy data output 126 and provides a control signal to a respective memory/redundancy output multiplexer 112 over the control output 128.

The redundant memory word comprises NRED comparators 202-1, 202-2, . . . , 202-NRED (202) for comparing addresses received over the data/address/read/write input 120 with addresses of failing memory words available over the address/block-ID/enable input 124. Therefore, an address input of each comparator 202 is connected to the data/address/read/write input 120, and a fail address input of each comparator 202 is connected to the address/block-ID/enable input 124. The array of redundant memory words 108a furthermore comprises a set of AND gates 204-1, 204-2, . . . , 204-NRED (204) following the comparators 202, wherein a first input of each AND gate 204 is connected to an output of each comparator 202. These AND gates 204 are for selecting redundant data stored in the array of redundant memory words 108a. The array of redundant memory words 108a furthermore comprises a block-ID comparator 206 comprising an input connected to the address/block-ID/enable input 124 for comparing a block-ID of an accessed address with the block-ID of a failing memory word. A further comparator 208 is connected to the address/block-ID/enable input 124 for receiving the enable bit. An AND gate 210 comprising a first and a second input is connected to an output of the block-ID comparator 206 and to an output of the comparator 208. If the block-ID of the accessed address and the stored address of a failing memory word are matching and if the enable signal is activated the AND gate 210 provides a high output signal to a second input of each AND gate 204. If a failing memory word of a memory 102 has been replaced by a redundant memory word of an array of redundant memory words 108a associated to this memory 102 one of the AND gates 204 provides a high output signal at an output thereof. All outputs of the AND gates 204 are connected to the inputs of another AND gate 212 which comprises an output connected to an inverted input of a further AND gate 214. The AND gate 214 comprises another input connected to the select input 122 of the respective array of redundant memory words 108a. The output of the AND gate 214 is connected to the chip select output 130 of the array of redundant memory words 108a for providing the chip select signal to an associated memory 102. The output of a respective AND gate 204 is further connected to the first inputs of a respective pair of AND gates 216, 218. A second input of one AND gate 216 of the pair of AND gates is connected to an output of an AND gate 220. A second input of the other AND gate 218 of the pair of AND gates is connected to an output of an AND gate 222. A first input of the AND gate 220 is connected data/address/read/write input 120 for receiving the write signal contained in the signal at the data/address/read/write input 120. A first input of the AND gate 222 is also connected to the data/address/read/write input 120 for receiving the read signal contained in the signal at the data/address/read/write input 120. A second input of the AND gates 220, 222 is connected to the select input 122. The AND gates 220, 222 decide, if data is to be read from or written to redundant memory words and if a select signal for the selection of the respective array of redundant memory words 108a is active at the select input 122 of the respective array of redundant memory words 108a. If this is the case, and if the address of an accessed memory word corresponds to a failing memory word, induced by a high signal at the outputs of the AND gates 216 or the AND gates 218 data may be written to (WR) or read from (RD) data registers 224-1, . . . , 224-NRED. The data registers 224 preferably are flip-flop based data registers comprising inputs respectively connected to the outputs of the AND gates 216, 218, and a respective data input connected to the data/address/read/write input 120 of the array of redundant memory words 108a. The data registers 224 further comprise a data output connected to data inputs of an output multiplexer 226. Besides the data inputs the output multiplexer 226 further comprises an output connected to the redundancy data output 128 of the array of redundant memory words 108a, and a plurality of control inputs connected to each output of each respective AND gate 218 for controlling the selection of the data output of a respective data register 224. An output AND gate 228 comprises a plurality of inputs also connected to each output of each respective AND gate 218, and an output connected to the control output 128 of the array of redundant memory words 108a.

Therefore, in the first embodiment, each array of redundant memory words 108a comprises NRED redundant memory words associated to each memory 102 resulting in a total of n*NRED redundant words. NRED redundant memory words of this sum of n*NRED redundant memory words can be activated globally, anywhere in the full (Mtot Kbit) address space. The above described shared-fuses/distributed-memory-words redundancy architecture allows to keep at a minimum the overhead due to test logic, fuse boxes and address registers, while maintaining the possibility to share the fuse information among all the memories. The presence of arrays of redundant memory words which are placed close to each memory allows to reduce the global wiring and minimizes the timing impact on the memory functional paths, thus simplifying place and route constraints and timing convergence in the back-end phase. The test logic, fuse boxes and address registers can be placed anywhere in the chip without causing any timing problems, since all the related timing paths are active in test mode only.

In an implementation example of the first embodiment there are 24 independent identical SRAMs, each one of a size of 2592×64 bits=162 Kbits. For floor-plan reasons, the 24 memories are separated in 4 sets of 6 memories each. Then 6 memories (n=6) are bundled together in test mode, for a total set size of 972 Kbits. Up to 6 memory words can be repaired by redundant memory words (NRED=6) anywhere in the 972 Kbits address space. Therefore, 6 redundant memory words, of 64 bits each, are associated to each memory. The applied technology is Infineon's 0.18 μm technology. The system clock speed is 125 MHz. The total chip area amounts to 143 mm$^2$. The realization of such a structure allows extending the word redundancy concept to the case of multiple functionally independent memories with advantages in terms of area overhead and/or attainable yield improvement with respect to the prior art. Thanks to the mixed shared-fuses/distributed-words redundancy architecture, the physical design is straightforward. No place and route constraints and/or timing convergence problems are reported. Area, timing and yield results are given in the following table, wherein the yield results are based on CIO yield estimation datasheets.

TABLE

| | |
|---|---|
| Total SRAM Area | 22.15 mm$^2$ (= 24 * 0.923 mm$^2$) |
| Area of redundant memory words | 1.56 mm$^2$ (= 24 * 0.065 mm$^2$) |
| Fuse-box Area | 0.3 mm$^2$ (= 4 * 6 * 0.0127 mm$^2$) |
| Area of test logic and address registers | 0.24 mm$^2$ (= 4 * 0.059 mm$^2$) |
| Total Area overhead due to test logic and redundancy logic | 2.1 mm$^2$ (= 1.56 + 0.3 + 0.24) or 9.5% of total RAM area |
| Access time of RAM without redundancy | 3.1 ns |
| Access time of RAM with redundancy | 3.9 ns (takes into account a multiplexer stage as well as output buffering) |
| Estimated chip yield without redundancy | 34.2% |
| Estimated chip yield with redundancy | 47.3% |

According to a second embodiment of the present invention a shared-fuses/shared-words architecture allows sharing fuse boxes, redundant memory words and address registers among functionally independent memories with a significant area reduction and yield improvement with respect to the prior art. In test mode, the test and repair procedures run on a group of memories as if they were a single larger memory, thus allowing to share redundant memory words, address registers and fuse boxes among all the memories.

FIG. 4 depicts a second embodiment of the system according to the present invention. In FIG. 4 the explanation of features corresponding to features in FIG. 1 is omitted. In contrast to the first embodiment according to FIG. 1 the redundancy logic 408 comprises a single block or array of redundant memory words 408a associated to all memories 402-1, ..., 402-n (402). The single array of redundant memory words 408a is located centrally anywhere in the test structure and redundant memory words can freely be allocated for repairing failing memory words of all memories 402. The array of redundant memory words 408a comprises a redundancy data output 426 connected to each redundancy data input 452-1, ..., 452-n (452) of a group of memory/redundancy output multiplexers 412-1, ..., 412-n (412). Furthermore, a control output 428 of the array of redundant memory words 408a is connected to each control input 454-1, ..., 454-n (454) of the group of memory/redundancy output multiplexers 412. A data/address input 420 of the array of redundant memory words 408a is connected to a data/address output 448-1, ..., 448-n (448) of each test multiplexer of a group of test multiplexers 410-1, ..., 410-n (410). In the second embodiment, the array of redundant memory words 408a preferably comprises a set of NRED redundant data registers, made e.g. by flip-flops with an associated compare logic (see FIG. 3 or 5) allowing to access each redundant memory word when accessing the corresponding programmed failing address. Therefore, there are a total of NRED redundant memory words that can be allocated anywhere in the full (Mtot Kbit) address space. The shared-fuses/shared-memory-words redundancy architecture according to the second embodiment allows keeping at a minimum the area overhead due to test logic, fuse boxes, address registers and redundant data registers, by allowing to share the fuse information and the redundant memory words among all the memories or memory blocks.

It is noted, that the logic surrounding each memory, which in each embodiment comprises a respective test multiplexer 110, 410 and a respective memory/redundancy output multiplexer 112, 412, and in the first embodiment additionally comprises a respective array of redundant words 108a is called wrapper logic 130-1, ..., 130-n and 430-1, ..., 430-n.

According to a further embodiment of the invention the system described above is also applicable for testing memories of different data width or word count. Then, the data multiplexer 118, 418 (FIG. 1 und 4) may be designed for a maximum word count e.g. 32 Bits. If a memory of a smaller word count for example 16 Bits is connected to the data multiplexer unused bits of the data width can be filled with additional bits by the data multiplexer. The comparator 196 (FIG. 2) ignores or gates out these invalid bits contained in the data signal at the data input 158 or 458.

An advantage of the present invention is that only one test logic is used for all memories leading to an area saving with respect to the prior art.

A further advantage of the present invention is that shared redundant addresses contained in address registers and fuse boxes allow reducing the number of required address registers and fuses. This reduces the area overhead, or, alternatively, increases the number of repairable memories leading to a yield improvement with respect to the prior art when considering an equivalent total of repairable addresses.

An advantage of the first embodiment according to the present invention is that, thanks to the mixed shared-fuses/distributed-memory-words redundancy architecture, which allows keeping the redundant memory words close to each memory, compared to the prior art the same timing impact occurs.

An advantage of the second embodiment according to the present invention is that shared redundant memory words lead to a considerable area reduction, or, alternatively, to an increase of the number of repairable memory words resulting in a yield improvement with respect to the prior art, when considering an equivalent total of repairable addresses.

LIST OF REFERENCE NUMERALS

102 functionally independent memory
104 data/address/read/write input
105 chip select input
106 memory data output
108 redundancy logic
110 test multiplexer
112 memory/redundancy output multiplexer
114 test logic
116 data multiplexer
118 fuse boxes
120 data/address/read/write input
122 select input
124 address/block-ID/enable input
126 redundancy data output
128 control output
130 chip select output
132 test address input
134 block-ID input
136 fail input
138 fail address input/output
140 data/address/block-ID/enable output
142 data/address/read/write input
144 test data/address/read/write input
146 enable input
148 data/address output
150 memory data input
152 redundancy data input
154 control input
156 data output
158 data input
160 test address output
162 test data output
164 read/write output
166 fail output
168 enable output
170 test address input
172 first test address output
174 select output
176 second test address output
178 block-ID output
180 data input
182 block-ID input
184 data output
186 fail address input/output
188 controller
190 test address register
192 test data register
194 read/write register
196 comparator
198 AND gate
202 comparator
204 AND gate
206 block-ID comparator
208 comparator
210 AND gate
212 AND gate
214 AND gate
216 AND gate
218 AND gate
220 AND gate
222 AND gate 224 data register
226 output multiplexer
228 output AND gate
402 functionally independent memory
404 data/address/read/write input
405 chip select input
406 memory data output
408 redundancy logic
410 test multiplexer
412 memory/redundancy output multiplexer
414 test logic
416 data multiplexer
418 fuse boxes
420 data/address/read/write input
422 select input
424 address/block-ID/enable input
426 redundancy data output
428 control output
430 chip select output
432 test address input
434 block-ID input
436 fail input
438 fail address input/output
440 data/address/block-ID/enable output
442 data/address/read/write input
444 test data/address/read/write input
446 enable input
448 data/address output
450 memory data input
452 redundancy data input
454 control input
456 data output
458 data input
460 test address output
462 test data output
464 read/write output
466 fail output
468 enable output
470 test address input
472 first test address output
474 select output
476 second test address output
478 block-ID output
480 data input
482 block-ID input
484 data output
486 fail address input/output
502 RAM memory module
504 memory built-in self test (MBIST) logic
506 redundancy logic
508 fuse boxes
510 first multiplexer
512 second multiplexer
514 read/write signal
516 write data signal
518 address signal
520 fail signal
522 fail_address signal
524 expected_data signal
526 data signal
528 control signal
530 connection
532 data signal
534 address signal
536 control signal
538 output
540 data signal
542 data signal
544 address register
546 write data register
548 address register
550 data register
552 comparator
554 result
556 controller
558 means for providing the fail signal 520
560 redundant word line
562 FA register
564 address register
566 data register
568 comparator
570 AND gate
572 AND gate
574 address (A)
576 Read (R)
578 Write (WR)
580 data input (DI)
582 serial interface (TDI)
584 serial interface (TDO)

The invention claimed is:

1. System for testing a group of functionally independent memories and for replacing failing memory words of said group of functionally independent memories by redundant memory words, comprising:
  (a) a redundancy means including at least one array of redundant memory words and address registers connected to said at least one array of redundant memory words for storing and retrieving addresses of failing memory words;
  (b) a test means including a test data output, a test address output, and a read/write output for providing test data, test addresses and read/write signals to each memory of said group of functionally independent memories;
  (c) a group of first multiplexers for respectively either connecting said test data output, said test address output, and said read/write output of said test means or a respective functional data/address/read/write input to a respective data/address/read/write input of an associated memory and to a respective data/address/read/write input of said at least one array of redundant memory words; and
  (d) a group of second multiplexers for respectively either connecting a respective memory data output of an associated memory or a respective redundancy data output of said at least one array of redundant memory words to a data output of a respective second multiplexer, wherein said data output of each second multiplexer is connectable to a data input of said test means for receiving data from each memory of said group of functionally independent memories.

2. System according to claim 1, wherein said test means including a test controller for at least generating test data and test address data, and an address transcoder for decoding test addresses of a test address space generated by said test controller into addresses of said memories.

3. System according to claim 1, wherein said system includes a data multiplexer comprising a plurality of data inputs respectively connected to said data outputs of said group of second multiplexers, and a data output connected to said data input of said test means.

4. System according to claim 1, wherein said redundancy means comprises plural arrays of redundant memory words, wherein each array is spatially and functionally associated to a respective memory of said group of functionally independent memories.

5. System according to claim 1, wherein said address registers of said redundancy means are connected to fuse boxes comprising fuses to permanently store the addresses of failing memory words.

6. System according to claim 1, wherein said group of functionally independent memories is a group of static random access memories (SRAM).

7. System according to claim 1, wherein said test means is a built-in self test means.

\* \* \* \* \*